US012604411B2

(12) United States Patent
Eichkorn

(10) Patent No.: US 12,604,411 B2
(45) Date of Patent: Apr. 14, 2026

(54) FLEXIBLE PRINTED CIRCUIT BOARD, IN PARTICULAR FOR CONNECTING ELECTRICAL AND/OR ELECTRONIC COMPONENTS

(71) Applicant: Robert Bosch GmbH, Stuttgart (DE)

(72) Inventor: Florian Eichkorn, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 177 days.

(21) Appl. No.: 18/436,098

(22) Filed: Feb. 8, 2024

(65) Prior Publication Data

US 2024/0268033 A1    Aug. 8, 2024

(30) Foreign Application Priority Data

Feb. 8, 2023    (DE) .................... 10 2023 201 015.1

(51) Int. Cl.
*H05K 1/18*      (2026.01)
*H05K 1/189*      (2026.01)

(52) U.S. Cl.
CPC ......... *H05K 1/189* (2013.01); *H05K 2201/05* (2013.01); *H05K 2201/09227* (2013.01); *H05K 2201/09236* (2013.01); *H05K 2201/09745* (2013.01); *H05K 2201/10181* (2013.01); *H05K 2201/10803* (2013.01)

(58) Field of Classification Search
CPC ................. H05K 1/189; H05K 1/0293; H05K 2201/10181; H05K 2201/10183; H05K 2201/10803
See application file for complete search history.

(56) References Cited

U.S. PATENT DOCUMENTS

| | | | |
|---|---|---|---|
| 2004/0189436 A1* | 9/2004 | Hill ...................... | H05K 1/0293 |
| | | | 337/297 |
| 2019/0006141 A1* | 1/2019 | Tsumagari ........... | H05K 1/0296 |
| 2021/0243879 A1* | 8/2021 | Kiya ........................ | H05K 1/16 |

* cited by examiner

*Primary Examiner* — Jeremy C Norris
(74) *Attorney, Agent, or Firm* — Michael Best & Friedrich LLP

(57) ABSTRACT

A flexible printed circuit board, in particular for connecting electrical and/or electronic components, includes a fuse conductor track (10). The fuse conductor track has a conductor width (B1) formed on the flexible printed circuit board (1). The fuse conductor track (10) has a taper (12) in a fuse area (11) of the fuse conductor track (10), at which the fuse conductor track (10) has a fuse width (B2) which is smaller than the conductor width (B1) of the fuse conductor track (10) outside the fuse area (11).

11 Claims, 5 Drawing Sheets

FLEXIBLE PRINTED CIRCUIT BOARD, IN PARTICULAR FOR CONNECTING ELECTRICAL AND/OR ELECTRONIC COMPONENTS

BACKGROUND

The invention relates to a flexible printed circuit board, in particular for connecting electrical and/or electronic components. The invention also relates to an electrical device comprising a flexible printed circuit board.

In electrical devices such as inverters in electric vehicles, flexible printed circuit boards, also known as flex foils, are used as connecting elements between electrical components such as printed circuit boards or power modules. Under fault conditions such as short circuits, a high current can flow through the flexible printed circuit board. In order to interrupt these high currents, fuses are used in the electrical devices which interrupt the power supply if the currents are too high.

SUMMARY

According to the invention, a flexible printed circuit board, in particular for connecting electrical and/or electronic components, is proposed. A fuse conductor track with a conductor width is formed on the flexible printed circuit board. According to the invention, the fuse conductor track has a taper in a fuse area of the fuse conductor track, at which the fuse conductor track has a fuse width that is smaller than the conductor width of the fuse conductor track outside the fuse area.

In contrast to the prior art, the flexible printed circuit board has a fuse integrated into the printed circuit board. The flexible printed circuit board, which is used in the electrical device to connect electrical and/or electronic components, also serves as a connector and as a fuse in the electrical device. If the current is too high, the fuse conductor track in the flexible printed circuit board is severed at the taper so that current can no longer flow through the fuse conductor track.

The conductor tracks can be designed particularly simply and freely for flexible printed circuit boards, so that a fuse conductor track with a corresponding taper can be easily incorporated into the layout of an existing flexible printed circuit board. The current-carrying capacity of the fuse in the fuse conductor track can be easily adapted to existing requirements.

The fuse is advantageously integrated into a flexible printed circuit board that is already present as a connecting element and the costs and installation space for an otherwise necessary additional separate fuse outside the flexible printed circuit board can be advantageously saved.

Flexible printed circuit boards, which are used as connectors between electrical and/or electronic components, often run in the air. The flexible printed circuit boards are often bent in the air as connectors, for example, in order to reach the connected electrical and/or electronic components. This means that the fuse conductor track in the flexible circuit board heats up only slightly passively via surrounding components and is therefore much more reliable than separate fuses or fuses on rigid printed circuit boards.

The flexible printed circuit board can be inserted into sockets at both ends, for example. This means that if the fuse blows, the flexible printed circuit board can be easily and inexpensively replaced with a new flexible printed circuit board, even in case of a failure of the fuse conductor track.

Further advantageous configurations and further developments of the invention are set forth in the disclosure.

According to an advantageous exemplary embodiment, it is provided that a further conductor track is formed on the flexible printed circuit board, wherein the fuse conductor track is spaced apart from the further conductor track in the fuse area. For example, the flexible printed circuit board can contain several conductor tracks. The additional conductor track can also form the return conductor to the fuse conductor track, for example.

According to an advantageous exemplary embodiment, it is provided that the fuse conductor track and the further conductor track run parallel to each other, at least in sections. If the additional conductor track forms the return conductor to the fuse conductor track, for example, the flexible printed circuit board is designed to be particularly low-inductive.

According to an advantageous exemplary embodiment, a recess is provided in the flexible printed circuit board, in particular in the fuse area, between the fuse conductor track and the further conductor track. The recess in the flexible printed circuit board separates the other conductor track from the fuse conductor track. The fuse conductor track is electrically and thermally insulated from the other conductor track by the recess. In this way, the fuse conductor track in the fuse area can be protected from influences of the other conductor track on the fuse conductor track. This prevents unintentional tripping of the fuse due to passive and active heating of the fuse conductor track. Furthermore, the other conductor track is protected from damage if the fuse conductor track burns out.

According to an advantageous exemplary embodiment, it is provided that the flexible printed circuit board has a first end and a second end, with the fuse conductor track running from the first end to the second end of the flexible printed circuit board. The first end and the second end can each be plugged into a socket of an electrical and/or electronic component, for example, and the fuse conductor track can establish an electrical contact between the electrical and/or electronic components.

According to an advantageous exemplary embodiment, it is provided that the first end of the flexible printed circuit board and/or the second end of the flexible printed circuit board is designed for electrical contacting of the flexible printed circuit board with electric and/or electrical components arranged outside the flexible printed circuit board. The ends can be plugged into sockets of the electrical and/or electronic components, for example. This allows the electrical and/or electronic components to be contacted with each other.

According to an advantageous exemplary embodiment, it is provided that the fuse conductor track runs over a strip-shaped web of the flexible printed circuit board. In particular, the taper is arranged on the strip-shaped web of the flexible printed circuit board. In this way, the taper of the fuse conductor track, which represents the fuse, can be protected from active or passive heating of the flexible printed circuit board, as it is difficult for this to spread to the strip-shaped web. This prevents unintentional triggering of the fuse due to active or passive heating of the flexible circuit board. Furthermore, triggering the fuse can destroy the strip-shaped web. The strip-shaped web can be broken through when the fuse is triggered. This leaves a well-defined air insulation gap between the broken ends of the fuse conductor track and other areas of the flexible printed circuit board outside the strip-shaped web are not affected by the triggering of the fuse.

According to an advantageous exemplary embodiment, it is provided that the fuse conductor track and the further conductor track outside the fuse area run on top of each other in different planes of the flexible printed circuit board. The additional conductor track can be designed as a return conductor of the fuse conductor track. In this way, an advantageous low-inductance connection can be established.

Furthermore, an electrical device comprising a flexible printed circuit board is proposed. The flexible printed circuit board is fastened in the electrical device in such a way that the flexible printed circuit board is bent and the fuse conductor track, particularly in the fuse area, runs in an arc in the electrical device. The flexible printed circuit board can be plugged into sockets at both ends as a connector, for example. The flexible printed circuit board thus runs largely in the air, for example. Because it is mounted in air, it heats up less passively and actively than a printed circuit board. The thermal design is therefore less unsafe and more reliable compared to a separate conductor fuse or a conductor track fuse on a rigid printed circuit board with mounted electrical components. When the fuse blows, an additional insulation gap is created between the open contacts of the fuse conductor track in a bent lyre plate when the fuse blows.

According to an advantageous exemplary embodiment, it is provided that the flexible printed circuit board in the electrical device is under preload. When the fuse blows, the flexible printed circuit board, in particular the strip-shaped web, can be severed in the fuse area. In this area, the flexible printed circuit board bends back to its original flat shape and the open contacts of the fuse conductor track are advantageously far apart. This provides an additional insulation distance between the open contacts of the fuse conductor track.

BRIEF DESCRIPTION OF THE DRAWINGS

Exemplary embodiments of the invention are illustrated in the drawing and explained in greater detail in the following description. Shown are:

FIG. 4 a schematic side view of an exemplary embodiment of the electrical device with an intact fuse, FIG. 5 a schematic side view of the exemplary embodiment of the electrical device with the fuse melted through.

DETAILED DESCRIPTION

Figure 1:
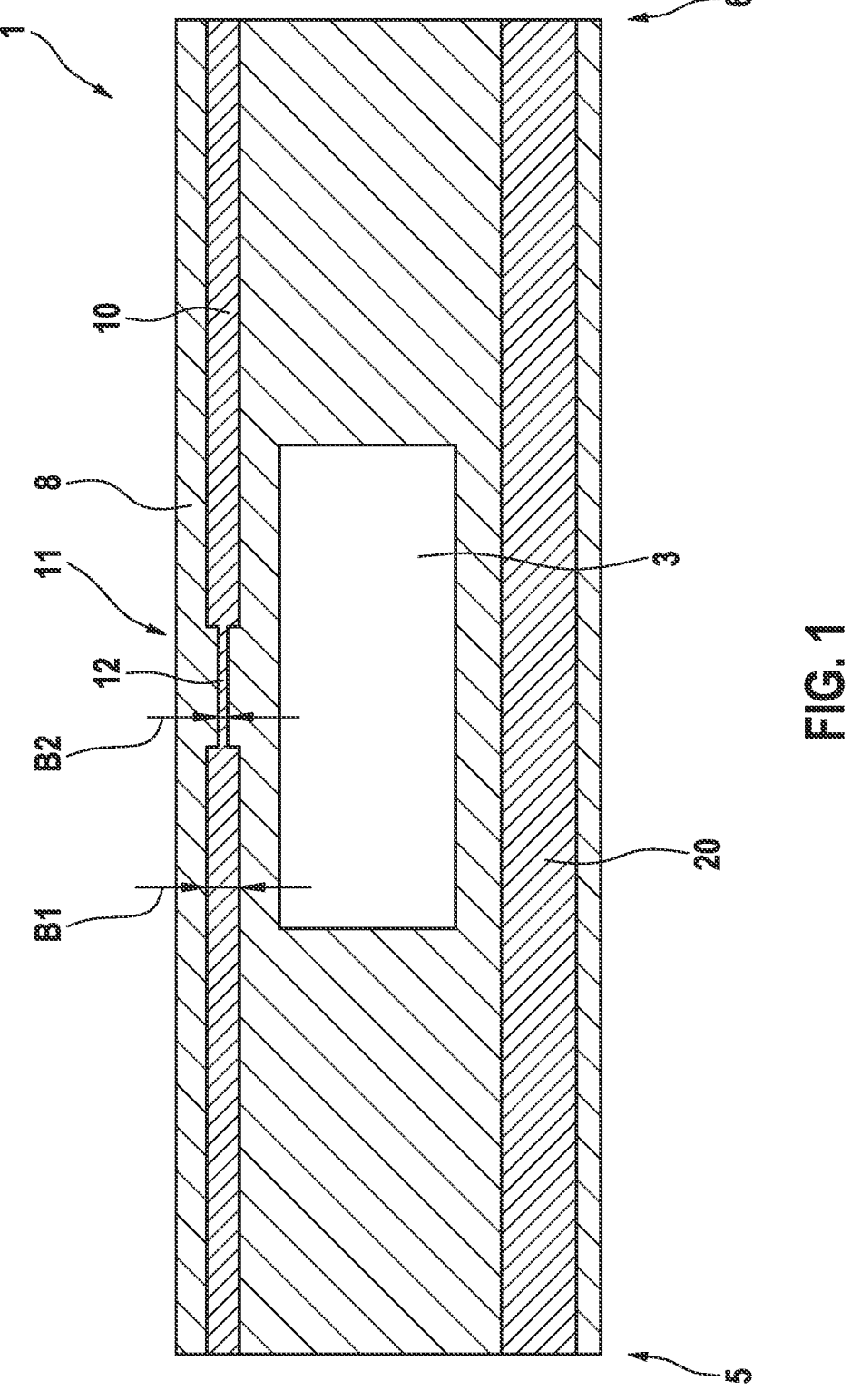
FIG. 1 a first exemplary embodiment of the flexible printed circuit board.
Figure 2:
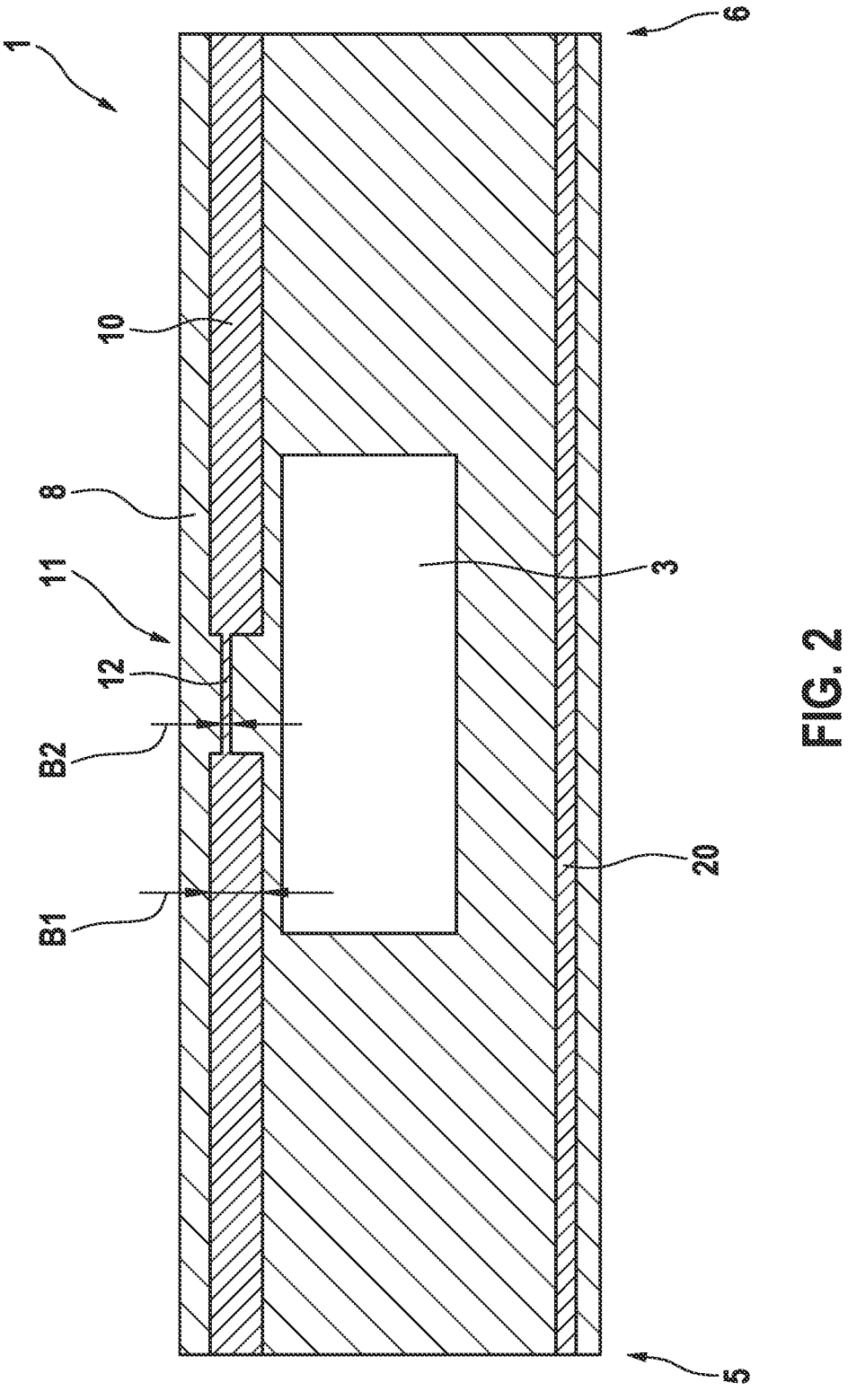
FIG. 2 a second exemplary embodiment of the flexible printed circuit board.
Figure 3:
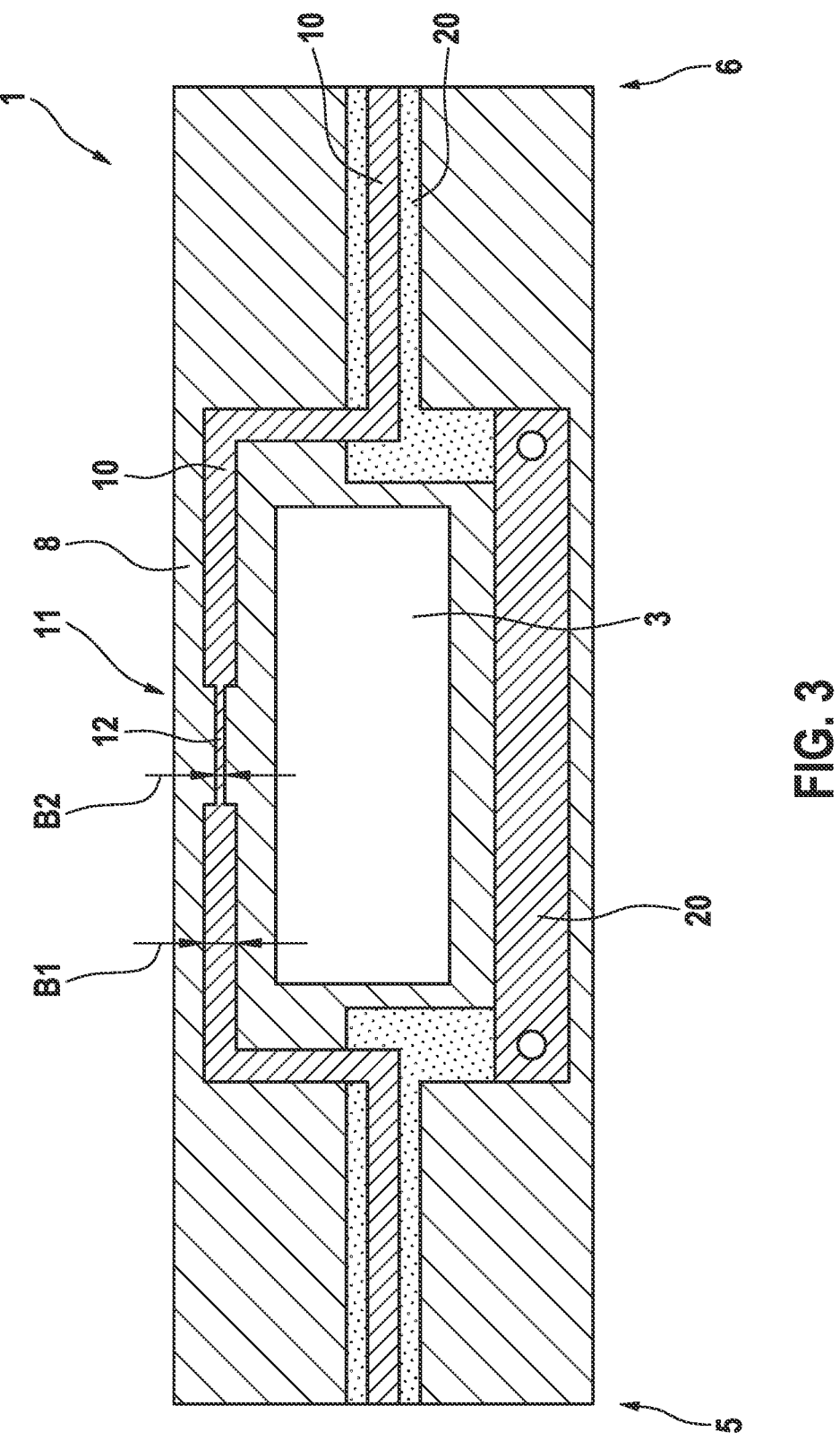
FIG. 3 a third exemplary embodiment of the flexible printed circuit board.
Figure 4:
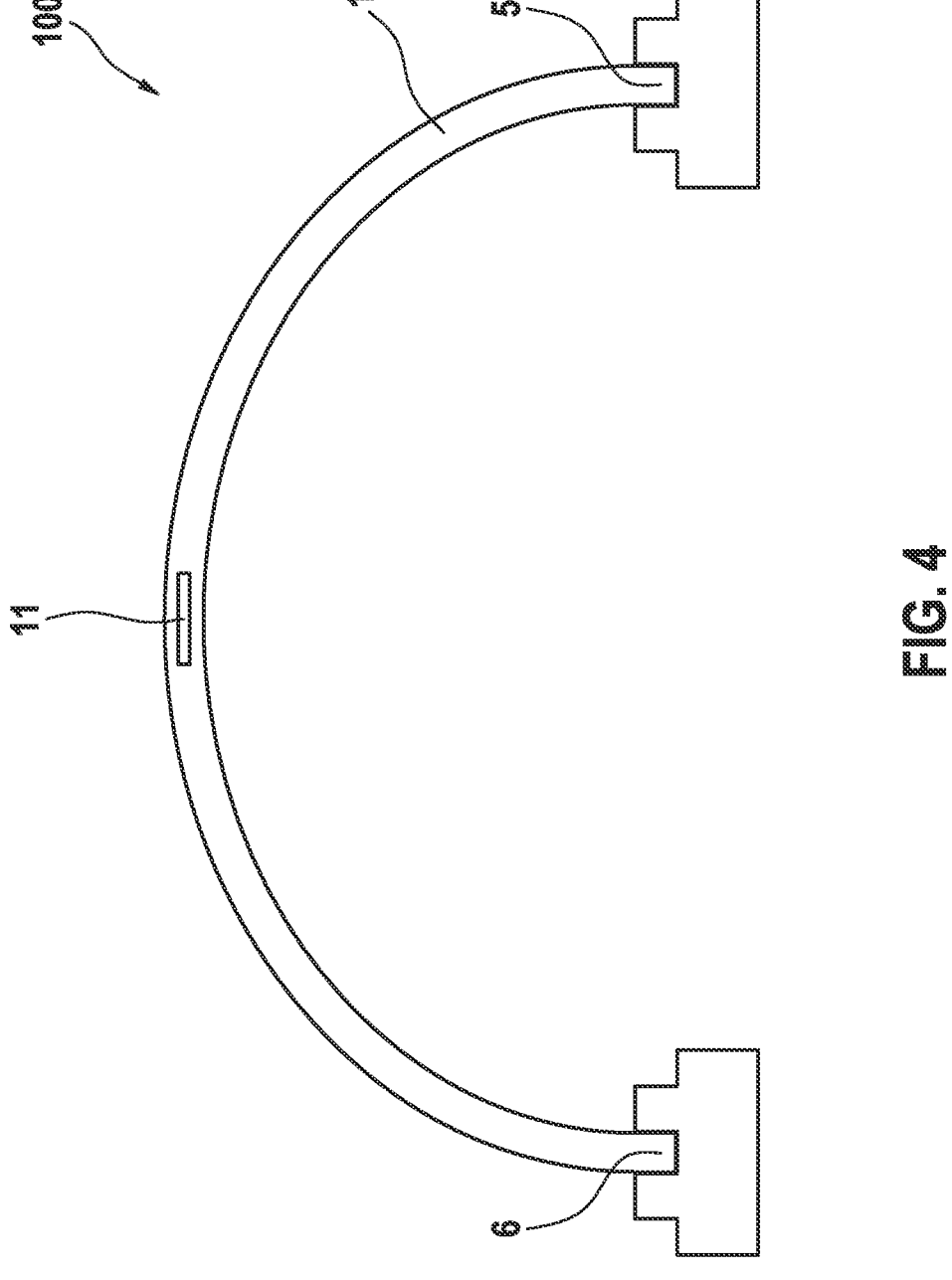
Figure 5:
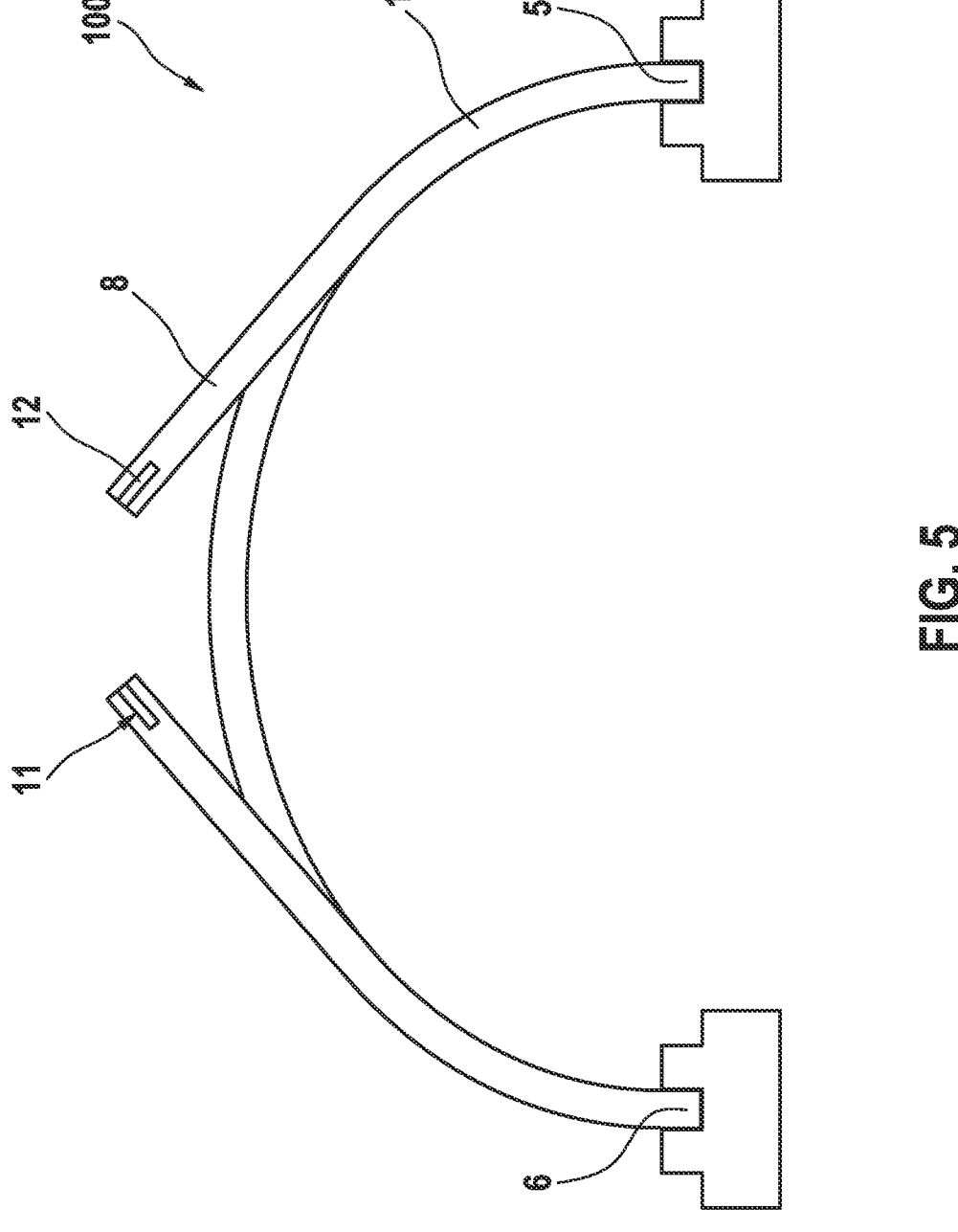

FIGS. 1 through 3 show top views of three different exemplary embodiments of a flexible printed circuit board 1. FIGS. 4 and 5 show an exemplary embodiment of an electrical device 100, wherein the device 100 comprises a flexible printed circuit board 1, for example a flexible printed circuit board 1 according to an exemplary embodiment from FIGS. 1 through 3.

The flexible printed circuit board 1 is designed as a flexible film and is therefore also known as a conductor film or flex film. The flexible printed circuit board 1 is made of an electrically insulating material and comprises conductor tracks 10, 20 made of an electrically conductive material. The flexible printed circuit board 1 can, for example, comprise a printed circuit built on a flexible plastic carrier, such as polyimide, Mylar, nylon, or polyester film. Copper, for example, can be used as the material for the conductor tracks 10, 20. The flexible printed circuit board 1 is designed, for example, as an FPC (flexible printed circuits), in particular as an FPC connector. For example, the flexible printed circuit board 1 has a considerable plastic bending capacity. The flexible printed circuit board 1 is used to connect electrical and/or electronic components. The flexible printed circuit board 1 can be used, for example, as a replacement for cables or press-fit pins to connect the electrical and/or electronic components, such as printed circuit boards, to one another. The conductor tracks 10, 20 of the flexible printed circuit board 1 are used to conduct electrical current and/or transmit signals.

The conductor tracks 10, 20 run, for example, from a first end 5 of the flexible printed circuit board 1 to a second end 6 of the flexible printed circuit board 1. The ends 5 and 6 of the flexible printed circuit board 1 can, for example, be plugged into connectors, for example of different electrical and/or electronic components, and thus establish an electrical contact between the different electrical and/or electronic components. The flexible printed circuit board 1 can be used, for example, as a connector in inverters or converters in automotive engineering. Additional electrical components not shown in the figures can also be mounted on the flexible printed circuit board 1.

One of the conductor tracks 10, 20 of the flexible printed circuit board 1 is designed as a fuse conductor track 10. The fuse conductor track 10 has a taper 12 at which the cross-section of the fuse conductor track 10, in particular the width of the fuse conductor track 10, is narrower than the rest of the fuse conductor track 10. At the taper 12, the fuse conductor track 10 has a fuse width B2 that is smaller than the conductor width B1 that the fuse conductor track 10 has outside the taper 12. For example, the fuse conductor track 10 has a fuse width B2 that is less than half the conductor width B1, in particular less than a quarter of the conductor width B1. The conductor width B1 and the fuse width B2 are each measured perpendicular to the direction of current through the fuse conductor track 10 and parallel to the flexible printed circuit board 1. The taper 12 is formed in a fuse area 11 of the fuse conductor track 10. The fuse conductor track 10 is designed as a narrow path in the fuse area 11, particularly in comparison to the rest of the fuse conductor track 10. The fuse conductor track 10 is cut through the fuse conductor track 10 in the fuse area 11 if the current is sufficiently high. This interrupts the current flow through the fuse conductor track 10 if the current is too high and the fuse conductor track 10 serves as an electrical fuse.

In addition to the fuse conductor track 10, the flexible printed circuit board 1 can have one or more further conductor tracks 20. The other conductor track 20 can, for example, form the return conductor of the fuse conductor track 10, in which the current runs in the opposite direction to the fuse conductor track 10. The other conductor track 20 can, for example, run parallel to the fuse conductor track 10, at least in sections. The fuse conductor track 10 is spaced from the other conductor track 20 at least in the fuse area 11, in which the fuse conductor track 10 is tapered. A recess 3 can be formed in the flexible printed circuit board 1 between the fuse area 11 of the fuse conductor track 10 and the other conductor track 20. The recess 3 in the flexible printed circuit board 1 breaks through the flexible printed circuit board 1. As shown in the figures, the fuse conductor track 10, in particular the fuse area 11 of the fuse conductor track 10, runs on a strip-shaped web 8 of the flexible printed circuit board 1. The strip-shaped web 8 is formed, for example, between one edge of the flexible printed circuit board 1 and the recess 3, as in the exemplary embodiments shown. The strip-shaped web 8 runs, in particular straight, between the recess 3 and the edge of the flexible printed circuit board 1. The strip-shaped web 8 is formed in one piece with the flexible printed circuit board 1. The strip-shaped web 8 is limited in particular by the recess 3 in the flexible printed circuit board 1 and the edge of the flexible printed circuit board 1. The strip-shaped web can also run between two recesses 3 in the flexible printed circuit board 1, for example. The fuse conductor track 10 runs over the strip-shaped web 8. In particular, only the fuse conductor track 10 runs over the strip-shaped web 8 and no other conductor track.

FIGS. 1 through 3 show different exemplary embodiments of the flexible printed circuit board 1. As shown in FIGS. 1 and 2, the conductor tracks 10, 20 can be of different widths. In the first exemplary embodiment of FIG. 1, the other conductor track 20 is wider than the fuse conductor track 10. In the second exemplary embodiment shown in FIG. 2, the fuse conductor track 20 is wider than the other conductor track 10. In both exemplary embodiments, the conductor tracks 10, 20 run parallel to each other. In the exemplary embodiment shown in FIG. 3, the additional conductor track 20 runs partially below the fuse conductor track 10. The other conductor track 20 runs in an area outside the fuse area 11 below the fuse conductor track 10. In this area, the fuse conductor track 10 and the other conductor track 20 run parallel to each other in different planes of the flexible printed circuit board 1.

FIG. 4 shows a schematic representation of an exemplary embodiment of the electrical device 100 comprising a flexible printed circuit board 1 in side view. In the illustration in FIG. 4, the fuse conductor track 10 is not blown and the fuse is therefore intact. The flexible printed circuit board 1 serves as an electrical connector in the electrical device 100. The ends 5, 6 of the flexible printed circuit board 1, between which the fuse conductor track 10 runs, are fastened in such a way that the printed circuit board 1 is bent. The ends 5, 6 of the flexible printed circuit board 1 are each plugged into a connector, for example. The flexible printed circuit board 1 is bent and fixed in the electrical device 100 in such a way that the flexible printed circuit board 1 is energized. The fuse conductor track 10 in the flexible printed circuit board 1 runs along the bend of the flexible printed circuit board 1. The fuse conductor track 10 runs in an arc in the electrical device 100, at least in the fuse area 11. The flexible printed circuit board 11 is pretensioned in the electrical device 100, in particular in the fuse area 11 of the fuse conductor track 10. If the fuse area 11 of the fuse conductor track 10 is severed at the taper 12 by an excessively high current through the fuse conductor track 10, the energized strip-shaped web 8 of the flexible printed circuit board 1 is also severed.

FIG. 5 shows a schematic representation of the electrical device 100 from FIG. 4 with the fuse conductor track 10 melted through. The fuse conductor track 10 is severed at the taper 12. Due to the pre-tensioning in the flexible printed circuit board 1 in the electrical device 100, the severed ends of the strip-shaped web 8 move away from each other so that the ends are widely spaced apart.

Of course, further exemplary embodiments and mixed forms of the illustrated exemplary embodiments are also possible.

The invention claimed is:

1. A flexible printed circuit board comprising: a fuse conductor track (10) with a conductor width (B1) being formed on the flexible printed circuit board (1), wherein the fuse conductor track (10) has a taper (12) in a fuse area (11) of the fuse conductor track (10), at which the fuse conductor track (10) has a fuse width (B2) which is smaller than the conductor width (B1) of the fuse conductor track (10) outside the fuse area (11), wherein a further conductor track (20) is formed on the flexible printed circuit board (1), the fuse conductor track (10) being spaced apart from the further conductor track (20) in the fuse area (11), wherein a recess (3) is formed in the flexible printed circuit board (1) between the fuse conductor track (10) and the further conductor track (20), and wherein the recess (3), the fuse conductor track (10), and the further conductor track (20) intersect a plane of the circuit board that extends parallel to the conductor width (B1).

2. The flexible printed circuit board according to claim 1, wherein the fuse conductor track (10) and the further conductor track (20) run parallel to one another at least in sections.

3. The flexible printed circuit board according to claim 1, wherein the flexible printed circuit board (1) has a first end (5) and a second end (6), wherein the fuse conductor track (10) extends from the first end (5) to the second end (6) of the flexible printed circuit board (1).

4. The flexible printed circuit board according to claim 3, wherein the first end (5) of the flexible printed circuit board (1) and/or the second end (6) of the flexible printed circuit board (1) is configured for electrical contacting of the flexible printed circuit board (1) with electric and/or electrical components arranged outside the flexible printed circuit board (1).

5. The flexible printed circuit board according to claim 1, wherein the fuse conductor track (10) extends over a strip-shaped web (8) of the flexible printed circuit board (1).

6. The flexible printed circuit board according to claim 1, wherein the fuse conductor track (10) and the further conductor track (20) outside the fuse area (11) run one above the other in different planes of the flexible printed circuit board (1).

7. The flexible printed circuit board according to claim 1, wherein the flexible printed circuit board is for connecting electrical and/or electronic components.

8. The flexible printed circuit board according to claim 1, wherein the recess (3) is in the fuse area (11).

9. An electrical device comprising a flexible printed circuit board (1), the flexible printed circuit board comprising: a fuse conductor track (10) with a conductor width (B1) being formed on the flexible printed circuit board (1), wherein the fuse conductor track (10) has a taper (12) in a fuse area (11) of the fuse conductor track (10), at which the fuse conductor track (10) has a fuse width (B2) which is smaller than the conductor width (B1) of the fuse conductor track (10) outside the fuse area (11), wherein the flexible printed circuit board (1) is fastened in the electrical device (100) in such a way that the flexible printed circuit board (1) is bent and the fuse conductor track (10) runs in an arcuate manner in the electrical device (100).

10. The electrical device according to claim 9, wherein the flexible printed circuit board (1) is biased in the electrical device (100).

11. The electrical device according to claim 9, wherein the flexible printed circuit board (1) is bent and the fuse conductor track (10) runs in an arcuate manner in the fuse area (11).

* * * * *